United States Patent [19]

Atsumi et al.

[11] Patent Number: 5,428,571
[45] Date of Patent: Jun. 27, 1995

[54] DATA LATCH CIRCUIT HAVING NON-VOLATILE MEMORY CELL EQUIPPED WITH COMMON FLOATING GATE AND STRESS RELAXING TRANSISTOR

[75] Inventors: Shigeru Atsumi, Tokyo; Hironori Banba, Kawasaki, both of Japan

[73] Assignee: Kabushiki Kaisha Toshiba, Kawasaki, Japan

[21] Appl. No.: 200,438

[22] Filed: Feb. 23, 1994

Related U.S. Application Data

[62] Division of Ser. No. 917,957, Jul. 24, 1992, Pat. No. 5,311,470.

[30] Foreign Application Priority Data

Jul. 25, 1991 [JP] Japan .................. 3-186443

[51] Int. Cl.⁶ .................. G11C 11/40; G11C 16/02
[52] U.S. Cl. .................. 365/189.05; 365/185; 365/200; 365/230.08
[58] Field of Search .................. 365/154, 185, 189.05, 365/189.09, 189.11, 104, 200, 230.08; 371/10.1, 10.2, 10.3

[56] References Cited

U.S. PATENT DOCUMENTS

| | | | |
|---|---|---|---|
| 4,532,607 | 7/1985 | Uchida | 365/96 |
| 4,532,611 | 7/1985 | Countryman, Jr. | 365/200 |
| 4,571,707 | 2/1986 | Watanabe | 365/200 |
| 4,573,144 | 2/1986 | Countryman, Jr. | 365/185 |
| 4,621,346 | 11/1986 | McAdams | 365/227 |
| 4,663,740 | 5/1987 | Ebel | 365/185 |
| 4,788,663 | 11/1988 | Tanaka et al. | 365/185 |
| 4,803,659 | 2/1989 | Hallenbeck | 365/94 |
| 4,823,320 | 4/1989 | Smayling et al. | 365/185 |
| 4,852,063 | 7/1989 | McNutt | 365/185 |
| 4,943,943 | 7/1990 | Hayashi et al. | 365/185 |
| 4,980,859 | 12/1990 | Guterman et al. | 365/154 |
| 4,982,377 | 1/1991 | Iwasa | 365/185 |
| 4,984,212 | 1/1991 | Fukuda et al. | 365/230.03 |
| 5,005,155 | 4/1991 | Radjy et al. | 365/185 |
| 5,088,066 | 2/1992 | Castro | 365/230.06 |
| 5,231,602 | 7/1993 | Radjy et al. | 365/185 |
| 5,233,566 | 8/1993 | Imamiya et al. | 365/230.08 |
| 5,247,477 | 9/1993 | Norman | 365/185 |
| 5,303,189 | 4/1994 | Devin et al. | 365/189.06 |

OTHER PUBLICATIONS

IEEE J. of Solid State Circuits, vol. SC-21, No. 5, Oct. 1986, P. 7750784, J. Pathak et al. "A 19-ns 250-mW CMos Erasable Programmable Logic Device".

1985 IEEE International Solid-State Circuit Conference P. 162-3, S. Pathak et al. "A 25ns 16K CMos PROM Using a 4-Transistor Cell".

*Primary Examiner*—Joseph A. Popek
*Assistant Examiner*—Andrew Q. Tran
*Attorney, Agent, or Firm*—Banner & Allegretti, Ltd.

[57] ABSTRACT

A data latch circuit comprises a non-volatile memory cell having its threshold voltage changed in accordance with data to be stored therein, and a latch circuit. The cell has a transistor for writing data and a transistor for reading data. The writing and reading transistors has a common floating gate. The reading transistor has a threshold voltage lower than the writing transistor. During normal operation, a ground potential is applied to the control gate of the reading transistor. The latch circuit latches data in accordance with whether the non-volatile memory cell is in the on-state or off-state.

22 Claims, 3 Drawing Sheets

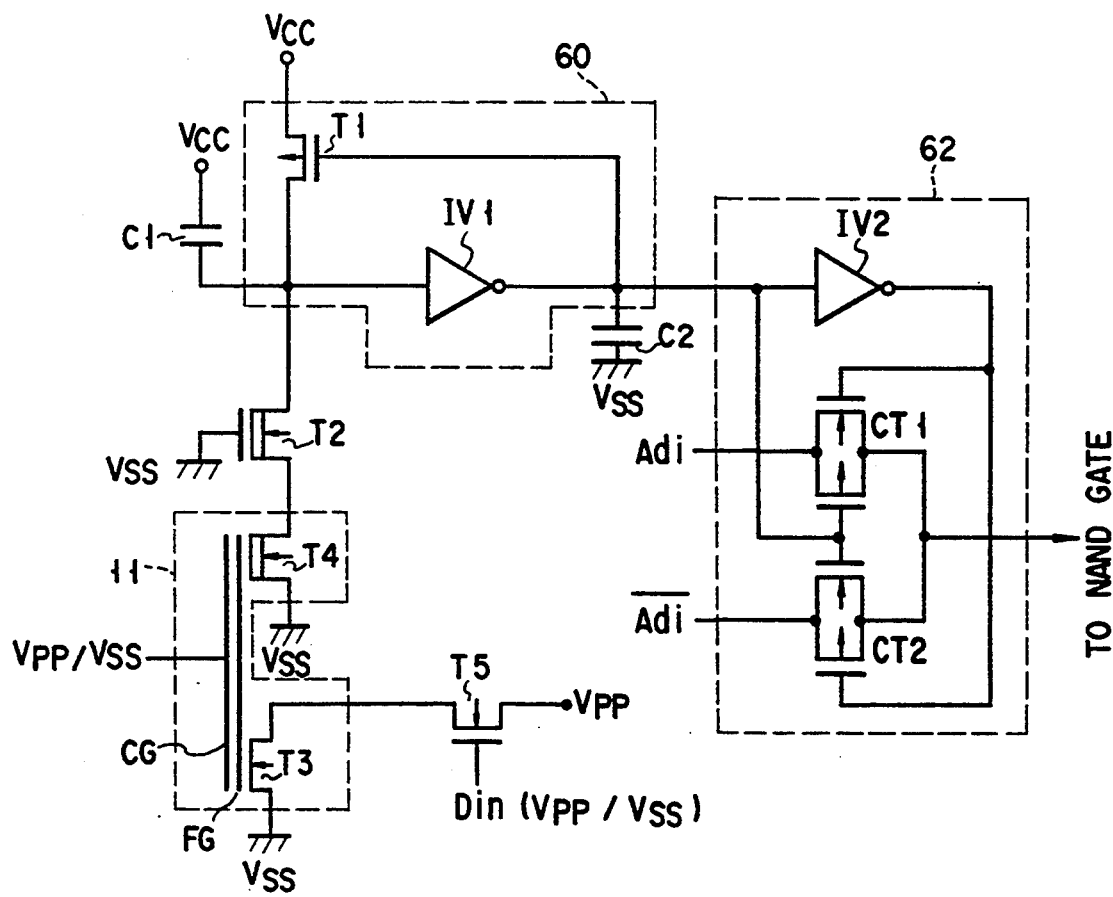
F I G. 1
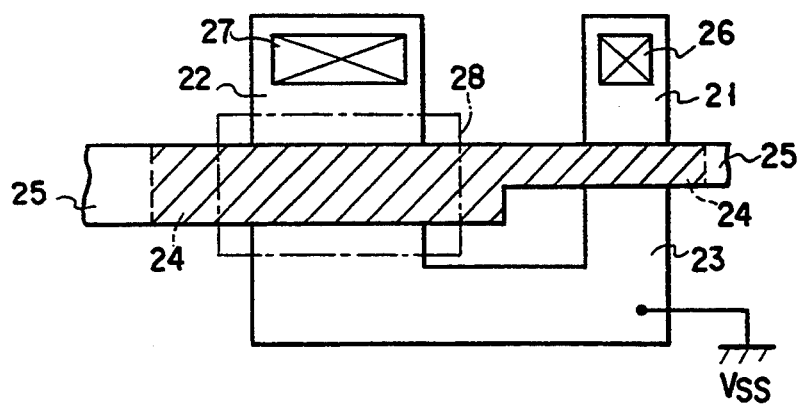
F I G. 2

DATA LATCH CIRCUIT HAVING NON-VOLATILE MEMORY CELL EQUIPPED WITH COMMON FLOATING GATE AND STRESS RELAXING TRANSISTOR

This application is division of application Ser. No. 07/917,957, filed Jul. 24, 1992, now U.S. Pat. No. 5,311,470.

BACKGROUND OF THE INVENTION

1. Field of the Invention

This invention relates to a non-volatile semiconductor memory device equipped with a transistor having a stacked gate structure and serving as a memory cell, and more particularly to a data latch circuit such as a defective address latch circuit provided in a redundancy circuit for storing defective addresses, or a redundancy signature circuit provided on a chip for informing the user of whether or not redundancy has been effected in the chip.

2. Description of the Related Art

In accordance with the increases in the memory capacity of a semiconductor memory devices, provision of a redundancy circuit has become indispensable in order to enhance the yield of production. The redundancy circuit, in general, has spare memory cells for compensating for a defective bit in the memory cell array, and a spare decoder consisting of a programmable address decoder with a fuse element group. The spare decoder is used to select one of the spare memory cells in place of a defective bit or memory cell. The spare programmable address decoder has defective address latch circuits for storing defective addresses. Each of the defective address latch circuits is provided for a corresponding one of address signals to be decoded. These circuits must be constructed such that stored data will not be lost even if the memory device is turned off or if the memory device is subjected to stress.

A fuse circuit applicable to part of a defective address latch circuit is disclosed in, for example, U.S. Pat. No. 4,621,346. The defective address latch circuit can be formed by connecting a selector circuit to the output node of the disclosed fuse circuit. The selector circuit outputs an address signal of 1-bit or the inverted signal of the address signal in accordance with whether or not the fuse employed in the fuse circuit has blown. Where one defective address latch circuit constructed as above is provided for each of the address signals to be decoded, and a fuse (or fuses) is selectively blown in accordance with defective address data, a corresponding defective address latch circuit (or circuits) outputs a signal of, for example, "H" level at the time of the defective address data being input, and a redundancy row or column line is selected on the basis of the output signal.

A laser fuse made of polysilicon or aluminum, which can be blown, generally by a laser beam, is used as the fuse of the defective address latch circuit.

In a non-volatile semiconductor memory device such as an EPROM (Erasable Programmable Read Only Memory), a non-volatile memory cell (hereinafter called an "EPROM" cell) can be used in place of the laser fuse. A circuit of this type is described in U.S. Pat. No. 4,803,659.

At the time of writing data into an EPROM, 0 V is applied to the source and substrate, and a high voltage is applied to the drain and control gate. As a result, an on-current flows between the drain and source, giving rise to a hot electron and a hot hole in the vicinity of the drain. The hole flows through the substrate as a substrate current, and the hot electron is injected into the floating gate, thereby increasing the threshold voltage of the EPROM cell and terminating the writing of data. Where the threshold voltage of the EPROM cell at the time of terminating of writing is sufficiently higher than a power source voltage used at the time of reading out data, and if the power source voltage is applied to the control gate of the EPROM cell during normal operation, the EPROM cell assumes the off-state or the on-state in accordance with whether it is in the writing or non-writing state, respectively. The off- and on-states of the EPROM cell can have the same function as the blown-state/non-blown-state of the laser fuse.

Where an EPROM cell is used in place of a laser fuse, writing for redundancy can be effected also when die-sort testing is made to a chip formed in a wafer, thereby reducing the number of die-sort tests required to be performed (i.e., the number of occasions of contact of a testing probe with a pad). Further, it is advantageous that redundancy can be performed in the chip even after it is packaged.

To cause an EPROM cell to assume the off-state, the amount of writing in the cell must be larger than a predetermined value (i.e., the amount of a change in the threshold voltage of the cell must be larger than a predetermined value). To cause the EPROM to assume the on-state, the cell current must be large. However, if the writing amount is not so large, the following problems may occur:

Though the power source voltage of an EPROM is generally 5 V±10%, 6.25±0.25 V is required in order to verify writing. In such a case, 6.5 V at most is applied to the control gate of the EPROM cell at the time of reading performed for verification. In addition, when the power supply voltage contains noise, as much as 8 V may momentarily be applied to the control gate of the cell during operation thereof. In such a case, even if the EPROM cell is in the writing state, a standby current will flow if the amount of writing is not sufficient, which may adversely affect a CMOS integrated circuit employing such EPROM cells. This is because elimination of the standby current is generally required in the CMOS circuit. In the worst case, the latched data is inverted, causing malfunction of the circuit.

Moreover, the reliability of the EPROM cell may be reduced as a result of data retention. Specifically, the threshold voltage of the EPROM cell in the writing state is reduced during operation a long period of time. The larger the amount of writing in the initial state, the greater the amount of reduction of the threshold voltage.

To prevent generation of the standby current, the writing amount must be determined so as to set the threshold voltage $V_{TH}$ of the EPROM cell in the writing state, to a predetermined value higher than 6.5 V. However, the larger the writing amount, the greater the amount of reduction of the threshold voltage as a result of data retention.

In summary, therefore, it is difficult to determine the writing amount in the EPROM cell so as to avoid the above-described disadvantages.

SUMMARY OF THE INVENTION

It is an object of the invention to provide a data latch circuit capable of easily determining the writing amount of a non-volatile memory cell.

It is another object of the invention to restrain a reduction in reliability which may be caused as a result of occurrence of a standby current and/or data retention.

It is a further object of the invention to provide a data latch circuit capable of decreasing limitations required to determine that amount of writing in the cell in the initial state which is necessary to bring the same into its writing state, to thereby prevent both occurrence of a standby current and a reduction in reliability resulting from data retention.

To attain the above objects, the data latch circuit of the invention comprises: a non-volatile memory cell having a writing transistor and a reading transistor, and disposed to store data, the writing and reading transistors having at least one control gate and a common floating gate, the reading transistor having a threshold voltage lower than the writing transistor, the control gate of the reading transistor being disposed to be supplied, during normal operation, with a constant voltage independent from a power source voltage; and latch means for latching potentials corresponding to the on- and off-states of the non-volatile memory cell.

In the circuit constructed as above, a constant voltage independent from the power supply voltage is applied to the control gate of the non-volatile memory cell during normal operation, and hence there will occur no problems relating to dependency upon the power supply voltage and/or a standby current due to noise contained in the power supply voltage. Therefore, it is not necessary to write a great amount of data into the non-volatile memory cell. Further, since a small amount of writing will be enough to make the memory cell assume its writing state, the influence of data retention will accordingly be reduced, which enhances the reliability of the memory cell. Therefore, limitations can considerably be decreased, which are required to determine that amount of writing in the cell in the initial state which is necessary to bring the same into its writing state, to thereby prevent both occurrence of the standby current and reduction of the reliability due to data retention.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a circuit diagram, useful in explaining a data latch circuit according to a first embodiment of the invention, and showing a case where the data latch circuit is applied to a defective address latch circuit in a redundancy circuit employed in an EPROM;

FIG. 2 is a plan view showing a pattern of an EPROM cell employed in the circuit of FIG. 1;

DETAILED DESCRIPTION OF THE PREFERRED EMBODIMENTS

Figure 3:
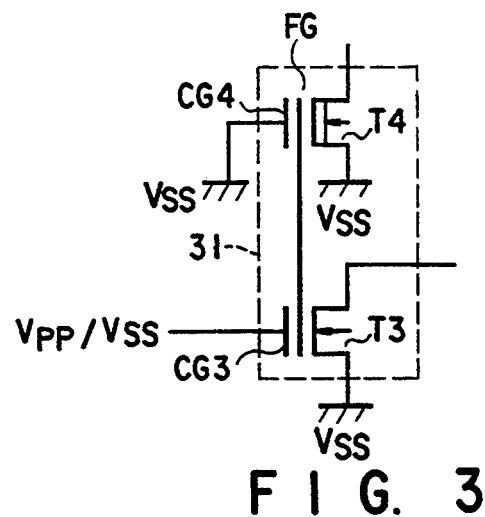
FIG. 3 is a circuit diagram, useful in explaining a modification of the EPROM cell shown in FIG. 1.

FIG. 1 shows a data latch circuit according to a first embodiment of the invention and applied to a defective address latch circuit in a redundancy circuit employed in an EPROM. A plurality of data latch circuits are respectively provided for address signals to be decoded.

The defective address latch circuit shown in FIG. 1 comprises an EPROM cell 11, a latch circuit 60, a selector circuit 62, a depletion-type n-channel MOS transistor T2, an enhancement-type n-channel MOS transistor T5, and capacitors C1 and C2. The latch circuit 60 includes a CMOS inverter circuit IV1 and a p-channel MOS transistor T1 for feedback control. The transistor T1 has a source connected to a power supply Vcc, a drain connected to the input node of an inverter circuit IV1, and a gate connected to the output node of the inverter circuit IV1. The capacitor C1 is connected between the input node of the inverter circuit IV1 and the power supply Vcc, and the capacitor C2 is connected between the output node of the same and a ground terminal Vss. The selector circuit 62 comprises a CMOS inverter circuit IV2 and two CMOS transfer gates CT1 and CT2, and is disposed to selectively output an address signal Adi of 1-bit and an inverted signal $\overline{Adi}$ in accordance with latch data from the latch circuit 60. The transistor T2 has a drain connected to the input node of the inverter circuit IV1, and a gate connected to the ground terminal Vss. The transistor T2 is provided for reducing stress acting upon an EPROM cell 11. The EPROM cell has a transistor T3 for writing data and a transistor T4 for reading data. Channel implantation was effected to make the reading transistor T4 be a depression type, and to make the writing transistor T3 be of the enhancement type. In the embodiment, a common floating gate FG and a common control gate CG are provided for the transistors T3 and T4. The common control gate CG is supplied with a high voltage Vpp at the time of writing for performing redundancy, and with a ground potential VSS during normal operation. The current path of the transistor T4 is connected between the source of the transistor T2 and the ground terminal Vss. The source of the transistor T3 is connected to the ground terminal Vss, and the enhancement-type n-channel transistor T5 to be used for write control is connected between the drain of the transistor T3 and a node to be supplied with a voltage Vpp for writing. The gate of the transistor T5 is supplied with write-in data Din, which has the high voltage Vpp at the time of writing for redundancy, and the ground potential Vss at the other times.

A technique of forming the writing and reading transistors by a single EPROM cell is disclosed in, for example, "ISSCC 85 DIGEST OF TECHNICAL PAPERS pp. 162-163, Pathak et al.", and "A 25ns 16K CMOS PROM using a 4-transistor Cell".

Then, the EPROM cell 11 will be explained in detail.

In general, ion implantation is not performed in the EPROM cell to made it of the depletion type, since doing so will cause a considerable reduction in writing efficiency. Therefore, in the EPROM cell 11 employed in the embodiment, the writing transistor T3 is of the enhancement type, and the reading transistor T4 is of the depletion type, whereby writing can be performed in the cell. More specifically, writing for redundancy can be performed by applying the high voltage Vpp to the control gate CG of the EPROM cell 11, and turning on the write control transistor T5 to apply the high voltage Vpp to the drain of the writing transistor T3.

The control gate CG of the cell 11 is supplied with the ground potential Vss during normal operation other than the writing for redundancy. Accordingly, when the cell 11 is in the writing state, if the transistor T4 has a positive threshold voltage, it is in the off-state. When the threshold voltage of the transistor T4 is, for example, approx. $-1.5$ V before writing, the amount $\Delta V_{TH}$ of a change in the threshold voltage due to wiring must be 1.5 V or more. This means that a small amount of writing will suffice at the initial state, which is advantageous for data retention. Thus, the reliability of the cell will be enhanced. On the other hand, when the EPROM cell 11 is in the non-writing state, the reading transistor T4 has a negative threshold voltage, and it is in the on-state if the control gate CG is supplied with the ground potential Vss. That is, to cause the reading transistor T4 to assume the on-state when the EPROM cell 11 is in the non-writing state, the voltage to be supplied to the control gate CG of the EPROM cell 11 is not limited to the ground potential Vss, but may be a constant voltage independent from the power supply voltage Vcc (e.g., a voltage between the power supply voltage Vcc and ground potential Vss). However, it is preferable to apply the ground potential Vss so as to completely eliminate the standby current.

Further, even if the drain voltage of the reading MOS transistor T4 is increased, the degree of increase is restrained, thereby preventing excessive stress from acting thereon, since the stress-relaxing MOS transistor T2 clamps the drain voltage of the transistor T4. Thus, there is no possibility that electrons accumulated in the floating gate pass through the gate oxide film of the transistor T4 as a result of an increase in the electric field caused between the floating gate and drain due to the increase in the drain voltage.

FIG. 2 shows a pattern of the EPROM cell 11. A first conductivity type diffusion region 21 is the drain region of the writing MOS transistor T3, and a first conductivity type diffusion region 22 is the drain region of the reading MOS transistor T4. These regions 21 and 22 are formed in a main surface region of a second conductivity type substrate. A first conductivity type diffusion region 23 is the source region of each of the transistors T3 and T4, and is formed in a main surface region of the substrate. The region 23 is connected to the ground terminal Vss. A floating gate 24 is formed on a first gate insulation film (not shown) formed on the substrate. A control gate 25 is formed on a second gate insulation film (not shown) formed on the floating gate 24. A drain/contact region 26 is provided for leading the drain of the transistor T3, while a drain/contact region 27 is provided for leading the drain of the transistor T4. A first conductivity type impurity is implanted into a diffusion region 28 so as to make the transistor T4 be of the depletion type.

In the pattern shown in FIG. 2, the writing transistor T3 has a short gate length L so as to enhance the writing efficiency, and the reading transistor T4 has a long gate length so as to prevent erroneous writing.

The operation of the defective address latch circuit shown in FIG. 1 will now be explained.

As is aforementioned, one defective address latch circuit as shown in FIG. 1 is provided for each of address signals to be decoded (FIG. 1 shows one corresponding to the address Adi). The EPROM cell 11 of a defective address latch circuit corresponding to a defective address, in which writing has been effected, has a high threshold voltage, while that of a defective address latch circuit corresponding to a normal address, in which writing is not effected, has a low threshold voltage.

Specifically, when a defect exists, the high voltage Vpp is applied to the control gate CG of the EPROM cell 11, and the write control transistor T5 is turned on thereby to apply the high voltage Vpp to the drain of the writing transistor T3. Thus, writing is effected, and the threshold voltage of the cell 11 is increased. The reading transistor T4 is kept off. As a result, capacitive coupling is performed by the capacitor C1 when the power supply is turned on, thereby increasing the potential of the input node of the inverter circuit IV1 and causing the output thereof to be at "L" level. Accordingly, the transistor T1 is turned on, and an increase in the potential of the input node is accelerated. At this time, the capacitor C2 keeps the potential of the output node of the inverter circuit IV1 at "L" level in the initial state, and causes the latch circuit 60 to easily assume its latch state. When the output of the inverter circuit IV1 has "L" level, that of the inverter circuit IV2 has "H" level. Thus, the transfer gates CT1 and CT2 of the selector circuit 62 are turned on and off, respectively, thereby selectively outputting the address signal Adi. The signal Adi is supplied from the circuit 62 to a coincidence circuit (not shown) comprising a NAND gate, etc. The coincidence circuit is supplied with outputs from the defective address latch circuits, and outputs a coincidence signal (of "L" level) when the outputs of all the defective address latch circuits are at "H" level.

On the other hand, when no defects exist, since writing is not effected in the writing MOS transistor T3 of the EPROM cell 11, and hence the threshold voltage of the reading MOS transistor T4 is low. Thus, even if the potential of the input node of the inverter circuit IV1 is increased by effecting capacitive coupling with the use of capacitor C1 when the power supply is turned on, it is kept at "L" level since the input node of the circuit IV1 is connected to the ground terminal Vss via the current paths of the transistors T2 and T4. Accordingly, the output of the circuit IV1 is at "H" level, and the transistor T1 is in the off-state. Since the output of the circuit IV1 is at "H" level, that of the inverter circuit IV2 is at "L" level. As a result, the transfer gates CT2 and CT1 of the selector circuit 62 are in the on-state and off-state, respectively, thereby selecting and outputting the address signal $\overline{Adi}$.

In the above-described defect address latch circuit employing the EPROM cell 11, during normal operation, a constant voltage independent from the power supply voltage Vcc is applied to the control gate CG of the EPROM cell 11, so that there will occur no problems relating to dependency upon the power supply voltage and/or a standby current due to noise contained in the power supply voltage. Therefore, it is not necessary to write a great amount of data into the EPROM cell 11, which facilitates data writing. Further, since a small amount of writing will be enough to make the cell 11 be in its writing state, the influence of data retention will accordingly be reduced, which enhances the reliability of the cell 11. Furthermore, the standby current can be restrained by controlling the constant voltage to an optimal value, and can be completely eliminated by using the ground potential Vss as the constant voltage. Therefore, limitations can considerably be decreased, which are required to determine that amount of writing in the cell 11 in the initial state which is necessary to bring the same into its writing state, to thereby prevent both occurrence of the standby current and reduction of the reliability due to data retention.

FIG. 3 shows a circuit equivalent to that shown in FIG. 1, useful in explaining a modification of the EPROM cell.

As is shown in FIG. 3, in an EPROM cell 31, though a writing transistor T3 and a reading transistor T4 have a common floating gate FG, they have respective control gates CG3 and CG4. The control gate CG3 of the writing transistor T3 is supplied with the high voltage Vpp at the time of writing for performing redundancy, and with the ground potential Vss during normal operation. The control gate CG4 of the reading transistor T4 is supplied with the ground potential Vss. The EPROM cell 31 operates in a manner similar to that of the EPROM cell 11 shown in FIG. 1, and can provide an effect similar thereto.

It is possible that the latch circuit 60 employed in the defect address latch circuit shown in FIG. 1 will not assume the original state once it latches defective data. To increase the margin of the latch circuit 60, it is preferable to use a defective address latch circuit as shown in FIG. 4.

Figure 4:
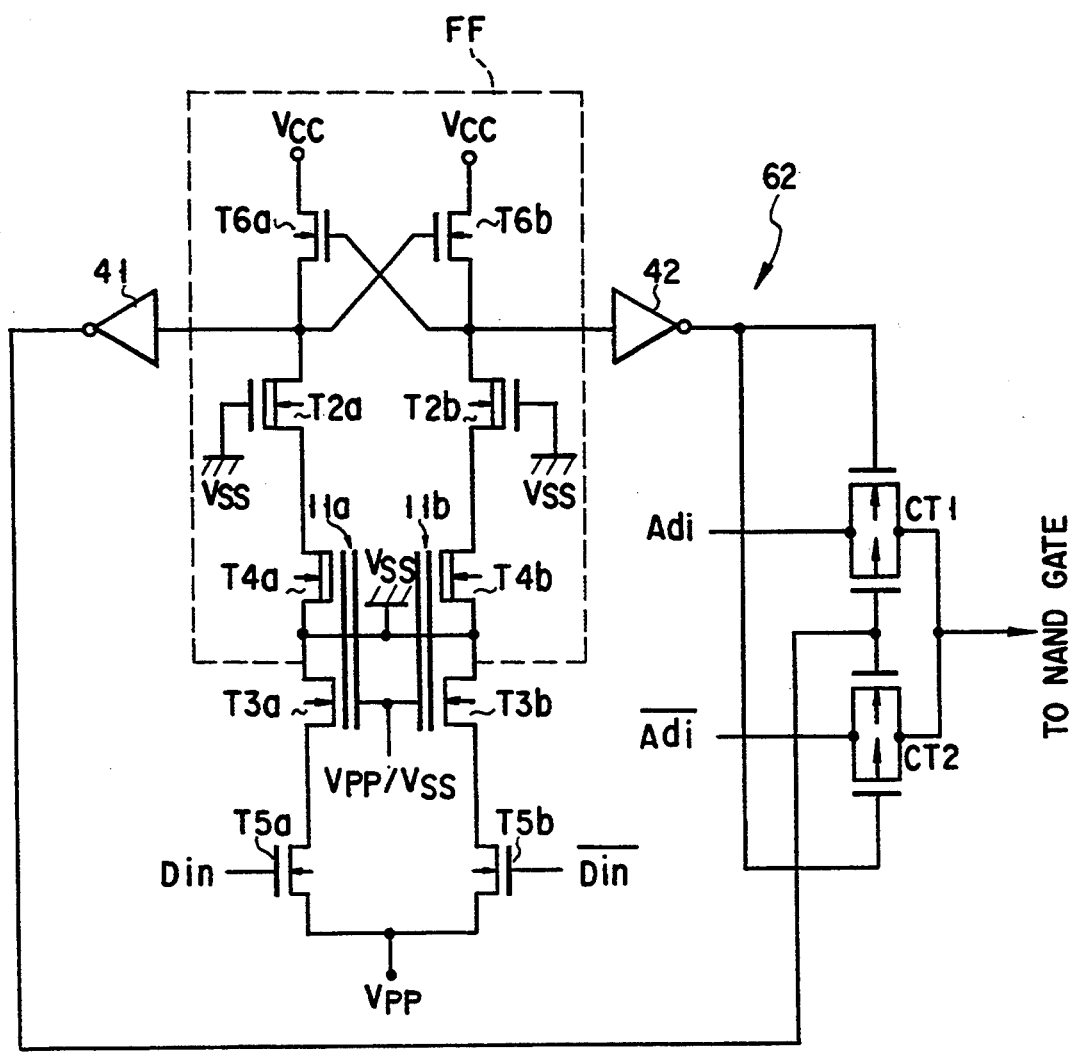
FIG. 4 is a circuit diagram, useful in explaining a data latch circuit according to a second embodiment of the invention, and showing a case where the data latch circuit is applied to the defective address latch circuit in a redundancy circuit employed in an EPROM.

FIG. 4 shows a defective address latch circuit according to a second embodiment of the invention. This circuit has stress-relaxing transistors T2a and T2b, EPROM cells 11a and 11b, and two write control transistors T5a and T5b, which are connected in a manner similar to those in FIG. 1. The EPROM cells 11a and 11b have the same size and pattern so as to be made symmetrical. The current paths of p-channel MOS transistors T6a and T6b serving as loads are connected between the drain of the transistor T2a and the power supply Vcc and between the drain of the transistor T2b and the power supply Vcc, respectively. The drain of the transistor T6a is connected to the gate of the transistor T6b, and the gate of the former is connected to the drain of the latter. The transistors T6a, T6b, T2a, and T2b, and reading transistors T4a and T4b incorporated in the EPROM cells 11a and 11b form a flip-flop circuit FF. The drains of the transistors T6a and T6b are connected to the input nodes of CMOS inverter circuits 41 and 42. The output nodes of the inverter circuits 41 and 42 are connected to the gates of CMOS transfer gates CT1 and CT2 so as to perform complementary switch control. Write control transistors T5a and T5b have gates to be supplied with complementary write data Din and $\overline{\text{Din}}$.

In the circuit constructed as above, at the time of writing for performing redundancy, the high voltage Vpp is applied to the control gates of the EPROM cells 11a and 11b, and one of the write control transistors T5a and T5b is turned on, thereby applying the high voltage Vpp to the drain of the writing transistor of one of the EPROM cells. Thus, writing is effected in one of writing transistors T3a and T3b, and not effected in the other of them.

In this state, when the ground voltage Vss is applied to the control gates of the cells 11a and 11b during normal operation, one of the reading transistors T4a and T4b is turned on and the other is turned off. If the stress-relaxing MOS transistors T2a and T2b have the same size, and the MOS load transistors T6a and T6b have the same size, the flip-flop circuit FF assumes a stable state corresponding to a complementary state of the reading transistors T4a and T4b of the EPROM cells 11a and 11b. The complementary outputs of the CMOS inverter circuits 41 and 42 complementarily control switching of the CMOS transfer gates CT1 and CT2, thereby selectively outputting the address signal Adi and the inverted address signal $\overline{\text{Adi}}$.

Since this circuit stores defective address data by complementarily performing writing in the two EPROM cells 11a and 11b, it can restore to a normal state even when defective data is once stored therein. Further, the circuit has a symmetrical structure, and hence has a large margin for noise caused when the power supply is turned on.

Figure 5:
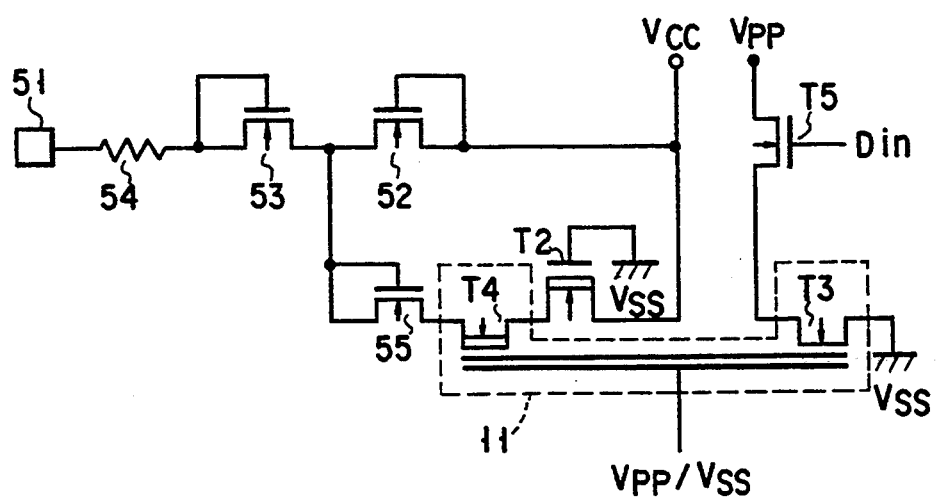
FIG. 5 is a circuit diagram, useful in explaining a data latch circuit according to a third embodiment of the invention, and showing a case where the data latch circuit is applied to a redundancy signature circuit employed in an EPROM.

FIG. 5 shows a redundancy signature circuit employed in the EPROM and according to a third embodiment of the invention. In this circuit, the above-described EPROM cell is used in place of the conventional fuse. The redundancy signature circuit is provided in a chip for informing the user whether or not redundancy has been performed in the chip.

A resistor 54, the current path of an n-channel MOS transistor 53, having its gate and source connected to each other, and the current path of an n-channel MOS transistor 52, having its drain and gate connected to each other, are connected in series. An EPROM cell 11 has a structure as shown in FIG. 1. The reading transistor T4 of the cell 11 has its drain connected to the power supply Vcc via the current path of a stress-relaxing MOS transistor T2, and its source connected to the connection node of current paths of the transistors 52 and 53 via an n-channel MOS transistor 55 having its gate and source connected each other. The writing transistor T3 of the cell 11 has its source connected to the ground terminal Vss, and its drain connected to the power supply Vpp for writing via the current path of a write control MOS transistor T5.

Where redundancy is effected in a chip employing a redundancy signature circuit as shown in FIG. 5, writing is effected in the EPROM cell 11. As a result, when the ground potential Vss is applied to the control gate of the cell 11 during normal operation, the reading transistor T4 of the cell 11 is turned off. On the other hand, where redundancy is not effected, writing is not performed in the cell 11. Thus, when the ground potential is applied to the control gate of the cell 11, the reading transistor T4 is turned on. The level of a terminal 51 for signature varies depending upon whether or not redundancy is effected in the chip. Thus, it can be determined by detecting the level of the terminal 51 whether or not redundancy is effected in the chip.

Though explanations have been made to EPROMs in the above-described embodiments, the invention is also applicable to a flash EEPROM (electrically erasable/programable read only memory). In this case, an EEPROM cell is used in a circuit as shown in FIGS. 1, 3, or 4, in place of the EPROM cell. This EEPROM cell has a reading transistor and a writing transistor. An ETOX (a trademark of U.S. company, Intel Corporation) type cell is known as a typical example of the EEPROM cell. The ETOX type cell has substantially the same structure as the above EPROM cell, and comprises a tunnel oxide-type EPROM which performs erasion using a tunnel current from the side of the source. In a case where such an ETOX type cell is used, the circuit shown in FIGS. 1, 3, or 4 is modified such that the high voltage Vpp is applied to the source of the writing transistor at the time of electrical erasion for performing redundancy, thereby turning off the write control transistor to thereby cause the drain of the writing transistor in a floating state.

Moreover, in the case of using such an ETOX type cell, the reading transistor can be made to be of the depletion type, by performing electric erasure where the initial threshold value of the reading transistor of the ETOX type cell is set at 0 V.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A data latch circuit comprising:
   a non-volatile memory cell having a writing transistor and a reading transistor, and disposed to store data, the writing transistor and the reading transistor having a control gate and a floating gate, the non-volatile memory cell being an erasable/programmable read only memory cell, the writing transistor and the reading transistor having the floating gate in common, the writing transistor being of an enhancement type the reading transistor being made as a depletion type in an initial state assumed before dam is written therein, the control gate of the reading transistor being disposed to be supplied, during normal operation, with a constant voltage independent of a power supply voltage; and
   protection means for protecting the non-volatile memory cell by relaxing stress applied thereto, the protection means including a depletion type stress-relaxing transistor which has a gate grounded and a current path having a first end connected to a first end of a current path of the reading transistor such that a potential of the first end of the reading transistor is clamped.

2. The data latch circuit according to claim 1, further comprising an external terminal and output means for outputting from the external terminal potentials corresponding to on and off states of the non-volatile memory cell.

3. The data latch circuit according to claim 2, wherein the output means includes a MOS transistor having a current path which has a first end connected to a second end of the current path of the reading transistor, first load means connected between the external terminal and a second end of the current path of the MOS transistor, and second load means connected between said power supply voltage and the second end of the current path of the MOS transistor.

4. The data latch circuit according to claim 2, wherein a second end of the current path of the stress relaxing transistor is connected to said power supply voltage.

5. The data latch circuit according to claim 2, further comprising a write control transistor which has a current path connected between a drain of the writing transistor and a power supply voltage used for writing, and has a gate to be supplied with said power supply voltage for writing at a writing time and to be supplied with a ground potential at a time other than the writing time.

6. The data latch circuit according to claim 1, wherein the reading transistor is made as a depletion type as a result of ion implantation.

7. The data latch circuit according to claim 1, wherein the reading transistor is made as a depletion type as a result of erasure for initialization.

8. The data latch circuit according to claim 1, wherein the constant voltage, independent of the power supply voltage applied to the control gate of the reading transistor during normal operation, is a ground potential.

9. The data latch circuit according to claim 1, wherein the writing transistor and the reading transistor have a common control gate.

10. The data latch circuit according to claim 1, wherein the reading transistor and the writing transistor have their respective control gates, and the control gate of the reading transistor is connected to a ground terminal.

11. The data latch circuit according to claim 1, further including other transistors wherein a gate length of the writing transistor is shorter than gate lengths of the other transistors, and a gate length of the reading transistor is longer than the gate lengths of the other transistors.

12. A data latch circuit comprising:
   a non-volatile memory cell having a writing transistor and a reading transistor, and disposed to store data, the writing transistor and the reading transistor having a control gate and a floating gate, the non-volatile memory cell being an erasable/programmable read only memory, the writing transistor and the reading transistor having the floating gate in common, the writing transistor being of an enhancement type, the reading transistor being made as a depletion type in an initial state assumed before data is written therein, the control gate of the reading transistor being disposed to be supplied, during normal operation, with a constant voltage independent of a power supply voltage;
   latch means for latching potentials corresponding to on and off states of the nonvolatile memory cell; and
   protection means for protecting the non-volatile memory cell by relaxing stress applied thereto, the protection means including a depletion type stress-relaxing transistor which has a gate grounded a current path having a first; end connected to a first end of a current path of the reading transistor and a second end connected to the latch means, such that a potential of the first end of the reading transistor is clamped.

13. The data latch circuit according to claim 12, further comprising selector means responsive to an output of the latch means for selecting one of an address signal and an inverted signal of the address signal.

14. The data latch circuit according to claim 12, wherein the reading transistor is made as a depletion type as a result of ion implantation.

15. The data latch circuit according to claim 12, wherein the reading transistor is made as a depletion type as a result of erasure for initialization.

16. The data latch circuit according to claim 12, wherein the constant voltage, independent of the power supply voltage applied to the control gate of the reading transistor during normal operation, is a ground potential.

17. The data latch circuit according to claim 12, wherein the writing transistor and the reading transistor have a common control gate.

18. The data latch circuit according to claim 12, wherein the reading transistor and the writing transistor have their respective control gates, and the control gate of the reading transistor is connected to a ground terminal.

19. The data latch circuit according to claim 12, further comprising a write control transistor which has a current path connected between a drain of the writing transistor and a power supply voltage used for writing, and has a gate to be supplied with said power supply voltage for writing at a writing time and to be supplied with a ground potential at a time other than the writing time.

20. The data latch circuit according to claim 12, wherein the latch means includes a CMOS inverter circuit, and a p-channel MOS transistor for performing feedback control, which has a source connected to said power supply voltage, a drain connected to an input node of the CMOS inverter circuit, and a gate connected to an output node of the CMOS inverter circuit.

21. The data latch circuit according to claim 20, further comprising a capacitor connected between the input node or the CMOS inverter circuit and said power supply voltage.

22. The data latch circuit according to claim 12, further comprising other transistors, wherein the gate length of the writing transistor is shorter than gate lengths of the other transistors, and the gate length of the reading transistor is longer than the gate length of the other transistors.

* * * * *